(12) United States Patent
Schober et al.

(10) Patent No.: US 8,456,248 B2
(45) Date of Patent: Jun. 4, 2013

(54) CIRCUIT ARRANGEMENT AND METHOD FOR SUPPLYING A CAPACITIVE LOAD

(75) Inventors: Uwe Schober, Glashütten (DE); Robert Schäfer, Frankfurt am Main (DE); Frank Kressmann, Eschborn (DE)

(73) Assignee: Braun GmbH, Kronberg (DE)

( * ) Notice: Subject to any disclaimer, the term of this patent is extended or adjusted under 35 U.S.C. 154(b) by 314 days.

(21) Appl. No.: 12/739,158

(22) PCT Filed: Sep. 12, 2008

(86) PCT No.: PCT/EP2008/007508
§ 371 (c)(1),
(2), (4) Date: Apr. 22, 2010

(87) PCT Pub. No.: WO2009/056189
PCT Pub. Date: May 7, 2009

(65) Prior Publication Data
US 2010/0315851 A1    Dec. 16, 2010

(30) Foreign Application Priority Data

Nov. 2, 2007    (DE) .......................... 10 2007 052 887

(51) Int. Cl.
*H03B 5/34* (2006.01)
(52) U.S. Cl.
USPC ............................ 331/73; 239/102.2; 131/273
(58) Field of Classification Search
USPC ............. 601/2; 131/273; 128/203.12, 203.26; 331/73; 219/210; 239/102.2; 310/321; 366/127
See application file for complete search history.

(56) References Cited

U.S. PATENT DOCUMENTS 6,183,426 B1 * 2/2001 Akisada et al. .................... 601/2
7,022,089 B2 * 4/2006 Ooba et al. ........................ 601/2

FOREIGN PATENT DOCUMENTS

| DE | 101 22 065 A1 | 12/2002 |
|---|---|---|
| EP | 0 677 335 A | 10/1995 |
| FR | 2 829 314 A | 3/2003 |
| JP | 03-215176 A | 9/1991 |
| JP | 06 006134 A | 1/1994 |
| JP | 2000-304850 A | 11/2000 |
| JP | 2002-086720 A | 3/2002 |
| JP | 2003-061194 A | 2/2003 |
| WO | WO 98/51255 | 11/1998 |

OTHER PUBLICATIONS

PCT Search Report, mailed Jan. 13, 2009, 4 pages.

* cited by examiner

*Primary Examiner* — Shawn Riley
(74) *Attorney, Agent, or Firm* — Brent M. Peebles

(57) ABSTRACT

A circuit arrangement (S) for supplying a load (P), whose essential electric property is capacitance, from a DC voltage source (U0) has a switch element (S1), which in the operational state is alternately switched between the conductive and non-conductive state, and at least one component (L1, L2) whose essential property is inductance, the load (P) being coupled into the circuit arrangement (S) in parallel to the component (L1, L2) so that the load (P) and the component (L1, L2) form a parallel resonant circuit, the switch element (S1) is connected between the parallel resonant circuit and a base voltage (GND) and the DC voltage source is to be applied in parallel (U0) to the load. The circuit arrangement (S) according to the invention can be used to drive the capacitive load (P) in a bipolar manner, the supply of the load in the non-conductive phase of the switch element (S1) being achieved by the component (L1, L2).

9 Claims, 3 Drawing Sheets

CIRCUIT ARRANGEMENT AND METHOD FOR SUPPLYING A CAPACITIVE LOAD

Figure 1:
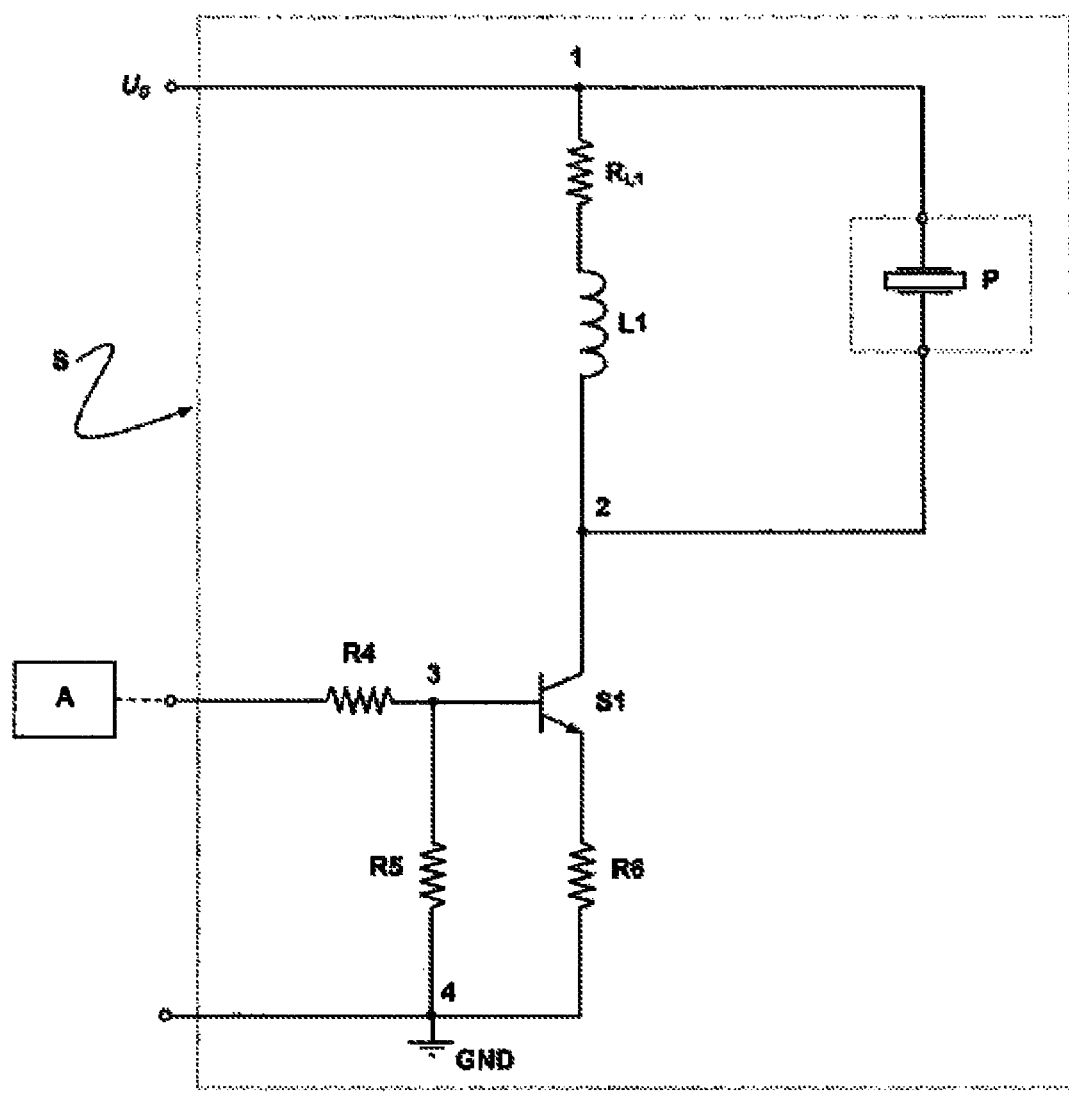

Circuit arrangements for supplying a capacitive load, especially a bipolar piezoelectric actuator, with an AC voltage from a DC voltage source are known.

Thus, DE 101 22 065 A1 shows that a piezoelectric actuator, which is activated in the bridge branch of an H-bridge circuit, receives an AC voltage fed from the H-bridge circuit that excites oscillations in the oscillating piezoelectric actuator. The H-bridge circuit has four FETs for this purpose that are driven by a voltage-controlled oscillator.

What is disadvantageous in this circuit arrangement is that four power FETs are required and expensive drive electronics are necessary for the FET.

It is therefore the object of the present invention to provide a method with which a capacitive load, especially a piezoelectric actuator, can be driven in a bipolar manner with a simple circuit arrangement.

This object is achieved by a circuit arrangement according to claim 1 and a method according to claim 5.

The proposed circuit arrangement for supplying a load, whose essential electric property is capacitance, from a DC voltage source has a switch element, which in the operational state is alternately switched between the conductive and non-conductive state, and at least one component whose essential property is inductance, the load being coupled into the circuit arrangement in parallel to the component, so that the load and the component form a parallel resonant circuit. The switch element is connected between the parallel resonant circuit and a base voltage, and the DC voltage source is to be applied in parallel to the load. In this circuit arrangement, a capacitive load is coupled in as a capacitance in a parallel resonant circuit and can therefore be supplied with a voltage that is directed counter to the direction of the DC voltage in a phase in which the switch element is switched to the non-conductive state via the inductive component. Altogether, such a circuit, following an oscillation cycle, can supply the capacitive load at least with an approximately sinusoidal AC voltage, and an at least approximately sinusoidal current flows through the load. If the load, for example, is an oscillating, bipolar piezoelectric actuator, it is caused to oscillate with a high degree of efficiency as a result.

In one embodiment of the circuit arrangement, the switch element in the operational state is connected with a dive electronics unit, which cyclically switches the switch element between the conductive and non-conductive states. As a result, even a system that does not freely oscillate can also be made to oscillate by an external drive circuit.

In an alternative embodiment, a feedback voltage from the parallel resonant circuit is fed back to a terminal of the switch element, in particular via a feedback capacitor, which is connected to a pick-off of the inductive component. As a result, a freely oscillating system can be created that needs no external drive circuit.

In another embodiment, the circuit arrangement is designed in such a way as to be operated with an operating frequency of the switch element in the ultrasound range of 20 kHz-1000 kHz, in particular in the range of 30 kHz-300 kHz. This enables in particular the drive of a piezoelectric actuator that is used in an atomizer to produce a fine fluid mist.

In the proposed method for supplying a load, whose essential electric property is capacitance, from a DC voltage source, the following steps are carried out: As a first step, a DC voltage from the DC voltage source is applied to a parallel resonant circuit comprising the capacitive load and at least one component connected in parallel thereto, whose essential electric property is inductance. Then, as a second step, a switch element that is connected between the parallel resonant circuit and a base voltage is switched to the conductive state. After that, as a third step, the switch element is switched to the non-conductive state, and as a fifth step, the load is supplied from the inductive component. Steps two to five are periodically repeated. In the described method, a capacitive load is used as the capacitance in a parallel resonant circuit. In phases in which a switch element is switched to the non-conductive state and, therefore, no current flows from the DC voltage source into the parallel resonant circuit, the capacitive load is supplied from the inductive component.

In an embodiment of the method, the steps of the respective switching of the switch element to the conductive and non-conductive states are controlled by a feedback of a feedback voltage to a terminal of the switch element. As a result, the system can freely oscillate.

In an alternative embodiment, the switch element is driven by drive electronics in the steps of the respective switching to the conductive and non-conductive states. As a result, a system that is not freely oscillating can also be excited into oscillation.

The invention also relates to an electrical device having a described circuit arrangement and a coupled capacitive load, in particular a piezoelectric actuator.

In one embodiment, the electrical device also has a DC voltage source that is connected to the circuit arrangement or can be connected to it in an operational state. The DC voltage source in particular represents a DC voltage that is approximately half of the peak-to-peak supply voltage of the capacitive load.

The electrical device can in particular be an atomizer for air humidification or for enrichment of the air with a liquid provided with aromatic substances or, for example, an inhaler for the atomization of a liquid medication.

The invention is explained in detail below using exemplary embodiments and with reference to Figures. In the figures, FIG. 1 shows a first exemplary circuit arrangement for supplying a capacitive load with an AC voltage from a DC voltage source, FIG. 2 shows a second exemplary circuit arrangement for supplying a capacitive load with an AC voltage from a DC voltage source, and FIG. 3 shows a schematic diagram of an electrical device in which a circuit arrangement according to the invention is used.

A first exemplary embodiment of a circuit arrangement S according to the invention is depicted in FIG. 1. It is essentially an LC parallel resonant circuit in which the capacitance is formed by the capacitive load P that can be coupled in (that is, a load in which the essential electric property is capacitance), the flow of current through the LC parallel resonant circuit being controlled by a controllable switch element S1. In the circuit arrangement S according to FIG. 1, a coil L1 (represented here by internal resistor $R_{L1}$) is connected by a first terminal to DC voltage $U_0$, which is generated by a (not depicted) DC voltage source (item 1 in FIG. 1), and is connected by a second terminal to a first terminal of switch element S1 (in this case: the collector of an npn transistor). Alternatively, a MOSFET can also be used as the switch element. Capacitive load P (in this case: a piezoelectric actuator) can be coupled in parallel to coil L1, so that a first terminal of capacitive load P is then in contact with DC voltage $U_0$ (item 1 in FIG. 1) and a second terminal of load P is connected between coil L1 and switch element S1 (item 2 in FIG. 1). Coil L1 together with the capacitive load P that is coupled in then forms the parallel resonant circuit. A drive terminal of switch element S1 (in this case: the base of the npn transistor) is coupled, at least in the operational state, to drive electronics A via a drive terminal resistor R4, while a second terminal of switch element S1 (in this case: the emitter of the npn transistor) is connected via an emitter resistor R6 to base voltage GND (item 4 in FIG. 1). The drive terminal of switch element S1 is likewise connected via a base resistor to base voltage GND. What is essential in circuit arrangement S according to FIG. 1 is that the capacitive load is used as the capacitance of the LC resonant circuit, and switch element S1 directs the flow of current in between into the LC resonant circuit. Drive terminal resistor R4, emitter resistor R6 and base resistor R5 are resistors that are used, for example, to limit currents and have a standard protective effect.

According to the invention, in a parallel resonant circuit, which itself is known, a capacitor that provides the capacitance of the LC parallel resonant circuit is replaced by a capacitive load P, which in the operational state of the circuit arrangement is supplied with a (at least approximately) sinusoidal AC voltage. Capacitive load P is supplied here in the conductive state of switch element S1 via the behavior of the parallel resonant circuit with a first (at least approximately sinusoidal) voltage half-wave, and a (at least approximately sinusoidal) current flows through the load. The supply of capacitive load P with the second half-wave of the AC voltage is provided from the coil of the LC parallel resonant circuit during the phase in which switch element S1 is switched to the non-conductive state by external drive electronics A. The voltage maxima present across capacitive load P here can be greater than the applied DC voltage, so that at a given DC voltage $U_0$ even a load P that requires a greater peak-to-peak voltage ($U_{peak\text{-}peak(load)}$) than the DC voltage that the DC voltage source can provide is supplied. In an exemplary embodiment, $U_0 \approx \frac{1}{2} U_{peak\text{-}peak(load)}$.

Figure 2:
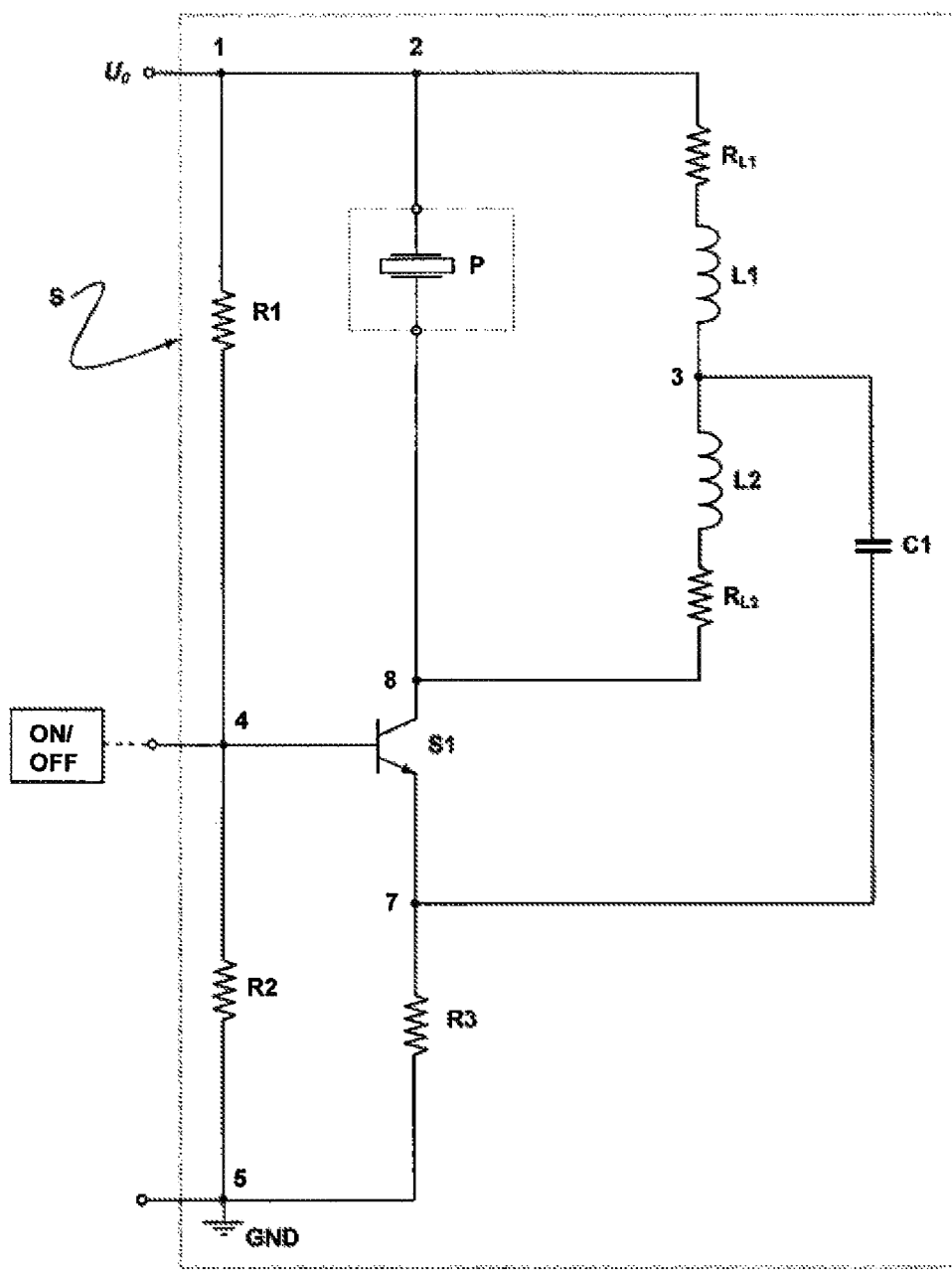
Figure 3:
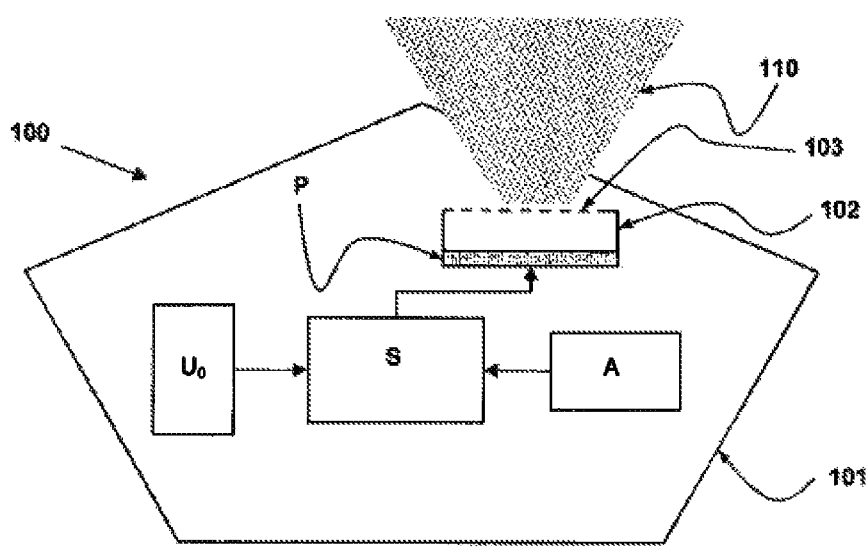

A second exemplary embodiment of a circuit arrangement according to the invention is depicted in FIG. 2. This is essentially a Hartley oscillator in a common base circuit. In this context, a DC voltage source (not depicted) provides a DC voltage $U_0$. In the base leg of a switch element S1, a voltage divider is configured from a first resistor R1 and a second resistor R2, first resistor R1 being in contact with DC voltage $U_0$ via a first terminal (item 1 in FIG. 2) and being connected via its second terminal to the first terminal of second resistor R2. The second terminal of second resistor R2 is connected to base voltage GND (ground) (item 5 in FIG. 2). Switch element S1 (in this case: a bipolar npn transistor) is connected with its drive terminal (in this case: the base of the npn transistors) between first and second resistors R1 and R2 (item 4 in FIG. 2). It is provided that a capacitive load can be coupled into the collector leg of switch element S1. A piezoelectric actuator as capacitive load P is depicted in the coupled state in FIG. 2. The first terminal of capacitive load P is in contact with DC voltage $U_0$ (item 2 in FIG. 2) and the second terminal of load P is connected to the first terminal of switch element S1 (in this case: with the collector of the npn transistor). A coil with a pick-off is arranged parallel to capacitive load P. Alternatively, two coils connected in series can also be used. For the sake of simplicity, these will hereinafter be referred to as a first coil and a second coil. A first coil L1 (depicted here with internal resistor RL1) is connected via its first terminal to DC voltage $U_0$ (item 2 in FIG. 2) and via its second terminal to the first terminal of second coil L2 (depicted here with internal resistor RL2). The second terminal of second coil L2 is connected to the first terminal of switch element S1 (in this case: to the collector of the npn transistors). A feedback capacitor C1 is connected via its first terminal to the pick-off that ties in between the first and second coils L1 and L2 (item 3 in FIG. 2). The feedback capacitor C1 is connected via its second terminal to the second terminal of switch element S1 (in this case: via item 7 in FIG. 2 to the emitter of the npn transistor). The second terminal of switch element S1 (in this case the emitter of the npn transistor) is in contact via a third resistor R3 (arranged in the emitter leg of switch element S1) with the base voltage GND (item 5 in FIG. 2).

In the case of the inductive voltage divider, which is formed from the first and second coils, it is not necessary that the first and the second coils L1 and L2 have the same inductance, but it is a design that makes sense.

In the circuit arrangement S according to FIG. 2, the voltage divider determines the operating point of switch element S1 from the first and second resistors R1 and R2. The feedback capacitor C1 provides for the positive feedback of a feedback voltage to the second terminal of switch element S1 (in this case: the emitter of the npn transistor). The third resistor R3 in like manner is used in a known manner for raising the emitter voltage for the feedback and can also be replaced by a coil for a slight damping effect. If the circuit arrangement S is placed in operation with coupled load P (for example, by the DC voltage being switched on or by the switch element S1 being switched on via external ON/OFF drive electronics if the DC voltage is already present), then load P, whose essential electrical property is capacitance, has no resistance and applies the DC voltage to the first terminal of the switch element. As soon as the capacitance of load P is charged, a voltage at load P drops, which reduces the voltage at the first terminal of switch element S1. The feedback capacitor C1, which is coupled to the second terminal of switch element S1 (in this case: to the emitter of the npn transistor) feeds back a feedback voltage that causes the oscillation to start and also maintains it. In the phase in which the switch element S1 is in the conductive state, the capacitive load P is supplied with a first half-wave of an approximately sinusoidal AC current, and an approximately sinusoidal current flows through capacitive load P. Due to the known behavior of complex voltages in a parallel resonant circuit, the maximum voltage present across load P can be greater than the maximum DC voltage source. As soon as switch element S1 is switched into a non-conductive state by the varying voltages across the first and second terminals, the flow of current from the DC voltage source through the LC resonant circuit stops. The energy stored in the first and second coils L1 and L2 is then discharged from the coils against the DC voltage that is present and thereby ensures a supply of the capacitive load P with a second voltage half-wave that is directed against the sinusoidal half-wave across load P during the conductive phase of switch element S1. The Hartley circuit shown in FIG. 2 to supply the capacitive load P is freely oscillating and does not require any external drive circuit for switch element S1. After a transient reaction, load P is supplied with a sinusoidal AC voltage in which the one voltage half-wave drops out across the load during the conductive phase of the switch element S1 and the second voltage half-wave is provided during the non-conductive phase of the switch element by component L.

Although a Hartley circuit itself is known, it is for supplying an external load with an AC voltage (for example by using the first and second coils L1 and L2 as the primary side coil of a transformer, the load being connected to the secondary coil of the transformer). However, according to the invention, a capacitive load P is supplied with a sinusoidal AC voltage, the capacitive load P (in this case a piezoelectric actuator) being used as the capacitance connected in parallel to the inductance of the coil, that is, no additional capacitor is needed to supply the load. The voltage maxima, which in this context are present across load P, are greater than the DC voltage that is provided by the DC voltage source.

If the load is a piezoelectric actuator having a capacitance of approximately $C_P$=5 nF, then, at a targeted frequency operating frequency of approximately f=90 kHz, coil inductances of $L_L$=150-330 µH can be selected, the circuit arrangement S still functioning even at higher and lower values (but at the same quality level as with components that are optimally matched with each other). The capacitance of the feedback capacitor C1 in the Hartley circuit can be selected as a function of the switch element S1 at about $C_{C1}$=20-100 nF and the third resistor R3 at about 20-200Ω. The DC voltage source $U_0$ is to be selected at the specified values in such a way that a DC voltage $U_0$ is provided that is approximately half as large as the required peak-to-peak supply voltage $U_{peak-peak(load)}$ of load P (for example, about 30 V, if a $U_{peak-peak(load)}$ of about 60 V is to be produced). Generally, the operating frequency f can be in the ultrasound range of 20 kHz-1000 kHz, in particular in the range from 30 kHz-300 kHz.

In FIG. 3, an exemplary model for an electrical device 100 is shown in which a circuit arrangement S according to FIG. 1 or FIG. 2 is used. The circuit arrangement S is coupled to drive electronics A and is connected with a DC voltage source $U_0$. The DC voltage source can be, for example, a battery or an accumulator. Alternatively, the electrical device can be supplied with power from an external DC voltage source. In circuit arrangement S, a piezoelectric actuator P is connected as the load. Circuit arrangement S excites vibration in piezoelectric actuator P. The piezoelectric actuator here acts mechanically on a liquid, which is located in a reservoir 102 and is pressed through the pores of a membrane 103 by the mechanical vibrational excitation in a way that is itself known, so that a mist 110 of ultra-fine drops of liquid is formed. The mist can be used, for example, for air humidification or as a mist to be inhaled.

What is claimed is:

1. A circuit arrangement for supplying a load, whose essential electrical property is capacitance, from a DC voltage source, said circuit arrangement comprising:
   a) a switch element, which in the operational state is alternately switched between conductive and non-conductive states, and wherein a drive terminal of the switch element is connected or can be connected with drive electronics, which periodically switch the switch element to the conductive and non-conductive states; and
   b) at least one component whose essential property is inductance,
wherein the load is to be coupled into the circuit arrangement parallel to the component, so that the load and the component form a parallel resonant circuit, and further, the switch element is switched between the parallel resonant circuit and a base voltage, and the DC voltage source is to be applied in parallel to the load.

2. The circuit arrangement according to claim 1, wherein the switch element in the operational state is periodically switched to the conductive and non-conductive states via a feedback of a feedback voltage from the parallel resonant circuit to a terminal of the switch element.

3. The circuit arrangement according to claim 1, wherein the circuit arrangement is designed to be operated with an operating frequency of the switch element in the ultrasound range of 20 kHz-1000 kHz.

4. A method for supplying a load, whose essential electric property is capacitance, from a DC voltage source that includes the following steps:
   a) application of a DC voltage from the DC voltage source to a parallel resonant circuit comprising the load and at least one component connected parallel thereto, whose essential electrical property is inductance;
   b) switching of a switch element, which is connected between the parallel resonant circuit and a base voltage, to the conductive state,
   c) switching of the switch element to the non-conductive state,
   d) supply of the load from the component; and
   e) period repetition of the steps of switching the switch element to the respective conductive and non-conductive states and the supply of the load,
wherein the steps of the respective switching of the switch element to the conductive and non-conductive states is controlled by drive electronics that are connected with a drive terminal of the switch element.

5. The method according to claim 4, wherein the steps of the respective switching of the switch element to the conductive and non-conductive states are controlled by a feedback of a feedback voltage to a terminal of the switch element.

6. An electrical device having a circuit arrangement according to claim 1 and the load coupled into the parallel resonant circuit.

7. The electrical device according to claim 6, wherein the electrical device has a DC voltage source that is connected to the circuit arrangement or can be connected to the circuit arrangement in the operational state.

8. The electrical device according to claim 6, wherein the DC voltage source provides a DC voltage which is approximately half as large as the required peak-to-peak supply voltage of load.

9. The electrical device according to claim 6 wherein said electrical device is a vaporizer or an inhaler.

* * * * *